US009583652B2

(12) United States Patent
Lachowicz et al.

(10) Patent No.: US 9,583,652 B2
(45) Date of Patent: Feb. 28, 2017

(54) METHOD FOR THE WET-CHEMICAL ETCHING BACK OF A SOLAR CELL EMITTER

(75) Inventors: Agata Lachowicz, Karlstein (DE); Berthold Schum, Biebergemünd (DE); Knut Vaas, Alzenau (DE)

(73) Assignee: CSEM CENTRE SUISSE D'ELECTRONIQUE ET DE MICROTECHNIQUE SA—RECHERCHE ET DEVÉLOPPEMENT, Neuchâtel (CH)

( * ) Notice: Subject to any disclaimer, the term of this patent is extended or adjusted under 35 U.S.C. 154(b) by 181 days.

(21) Appl. No.: 13/820,540

(22) PCT Filed: Sep. 2, 2011

(86) PCT No.: PCT/EP2011/065231
§ 371 (c)(1),
(2), (4) Date: Jun. 3, 2013

(87) PCT Pub. No.: WO2012/028728
PCT Pub. Date: Mar. 8, 2012

(65) Prior Publication Data
US 2013/0255772 A1    Oct. 3, 2013

(30) Foreign Application Priority Data

Sep. 3, 2010 (DE) .................. 10 2010 037 311
May 5, 2011 (DE) .................. 10 2011 050 136

(51) Int. Cl.
H01L 31/0236  (2006.01)
C09K 13/08    (2006.01)
H01L 21/306   (2006.01)
H01L 31/0224  (2006.01)
H01L 31/18    (2006.01)

(52) U.S. Cl.
CPC ........ *H01L 31/02363* (2013.01); *C09K 13/08* (2013.01); *H01L 21/30604* (2013.01); *H01L 31/022425* (2013.01); *H01L 31/1804* (2013.01); *H01L 31/186* (2013.01); *Y02E 10/547* (2013.01); *Y02P 70/521* (2015.11)

(58) Field of Classification Search
CPC ......... H01L 21/32134; H01L 21/31111; H01L 31/0236; H01L 21/67086; H01L 31/022425; H01L 21/02381
See application file for complete search history.

(56) References Cited

U.S. PATENT DOCUMENTS

| | | | |
|---|---|---|---|
| 4,939,101 A * | 7/1990 | Black et al. | .................. 438/455 |
| 5,560,857 A | 10/1996 | Sakon et al. | |
| 6,068,788 A | 5/2000 | Kezuka et al. | |
| 6,180,497 B1 | 1/2001 | Sato et al. | |
| 6,375,738 B1 | 4/2002 | Sato | |
| 2003/0119332 A1 | 6/2003 | Kuebelbeck et al. | |
| 2009/0101197 A1 | 4/2009 | Morikawa | |
| 2009/0140350 A1 * | 6/2009 | Zhu | ............................. 257/397 |
| 2009/0199898 A1 * | 8/2009 | Do et al. | ...................... 136/256 |
| 2009/0280597 A1 | 11/2009 | Wijekoon et al. | |
| 2010/0112728 A1 * | 5/2010 | Korzenski | ......... H01L 21/02079 438/3 |

FOREIGN PATENT DOCUMENTS

| | | |
|---|---|---|
| CN | 101814547 | 8/2010 |
| DE | 19530944 | 4/1996 |
| DE | 69631233 | 11/2004 |
| DE | 102009005168 | 7/2010 |
| EP | 0757377 | 2/1997 |
| EP | 0926709 | 6/1999 |
| JP | H07115077 A | 5/1995 |
| JP | 2003101055 A | 4/2003 |
| JP | 2004266023 A | 9/2004 |
| WO | 9718582 A1 | 5/1997 |
| WO | 2006120735 A1 | 11/2006 |
| WO | 2009/013307 | 1/2009 |
| WO | 2009/084933 | 7/2009 |
| WO | 2010027232 A2 | 3/2010 |
| WO | 2010/081661 | 7/2010 |

OTHER PUBLICATIONS

International Search Report dated Aug. 3, 2012 corresponding to International Patent Application No. PCT/EP2011/065231.
Hofmann et al., "Industrial Type CZ Silicon Solar Cells with Screen-Printed Fine Line Front Contacts and Passivated Rear Contacted by Laser Firing," 23rd European Photovoltaic Solar Energy Conference, Sep. 1-5, 2008, Valencia, Spain, 4 pp.
English translation of the Written Opinion of the International Searching Authority dated Aug. 3, 2012 for corresponding PCT/EP2011/065231, 7 pages.
English translation of the International Preliminary Report on Patentability dated Mar. 5, 2013 for corresponding PCT/EP2011/065231, 8 pages.
Bastide et al., "Multicrystalline SI Texturization by Metal-Assisted Chemical Etching for Solar Cell Applications", Proceedings of the 22nd EUPVSEC, Milano, Italy 2007, 4 pages.
Huang et al., "Metal-Assisted Chemical Etching of Silicon: A Review", Advanced Materials 2011, vol. 23, Weinheim, Germany, pp. 285-308.

* cited by examiner

*Primary Examiner* — Duy Deo
(74) *Attorney, Agent, or Firm* — Ohlandt, Greeley, Ruggiero & Perle, L.L.P.

(57) ABSTRACT

A method for the wet-chemical etching of a highly doped silicon layer in an etching solution is provided. The method includes using, as an etching solution so as to perform etching homogeneously, an HF-containing etching solution containing at least one oxidizing agent selected from the group of peroxodisulfates, peroxomonosulfates, and hydrogen peroxide.

8 Claims, No Drawings

METHOD FOR THE WET-CHEMICAL ETCHING BACK OF A SOLAR CELL EMITTER

The invention relates to a method for the wet-chemical etching back of a highly doped silicon layer in an etching solution, the silicon layer having a dopant concentration of $10^{18}$ atoms/cm$^3$, in particular >$10^{19}$ atoms/cm$^3$, and the highly doped silicon layer being a surface region of an emitter of a crystalline solar cell.

Several chemical etching and cleaning processes are employed in the standard manufacturing sequence for crystalline solar cells.

In order to eliminate cutting damage and texture the surface, alkaline solutions containing organic additives are used for monocrystalline wafers. In this process, several micrometers must be eroded from the wafer surface in order to eliminate the damaged layers and etch pyramids with a size of 2 to 10 micrometers. The conventional process time lies in the range of 10-30 minutes, the temperature in the range of 80-95° C. The texturing results in a strong reduction in the reflection of the surface and the impinging light is utilized efficiently for power production.

The pyramids characteristic of monocrystalline wafers are formed because the etching rate of an alkaline solution strongly depends on the crystal orientation of the substrate; that is, silicon is generally etched anisotropically by alkaline solutions.

An isotropic etching solution must accordingly be employed for multicrystalline wafers. The etching rate is independent of the crystal orientation and the entire wafer surface is uniformly textured.

A solution composed of hydrofluoric acid and nitric acid is employed in standard practice for this purpose. In order to eliminate cutting damage and create texture, which, in this case, has the form of roundish elongated depressions, it is necessary to erode a silicon layer that is 3 to 10 micrometers in thickness. The conventional process time lies in the range of 60-180 seconds, the temperature in the range of 5-20° C.

Hydrofluoric acid and nitric acid constitute the base of the texturing solution. In a simplified model for the etching mechanism, it is assumed that nitric acid oxidizes the silicon to $SiO_2$, which is then dissolved by hydrofluoric acid. The etching operation is described by two partial reactions:

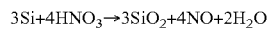
 Partial reaction 1:

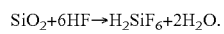
 Partial reaction 2:

The etching mechanism of the HF/$HNO_3$ etching solution is the subject of numerous investigations and proceeds in a far more complicated way via intermediates, which contain nitrogen species in the +III oxidation state. Nitrogen oxides, hexafluorosilicic acid, and water form as reaction products.

Depending on its concentration, the HF—$HNO_3$ etching solution can act to texture or to polish; that is, the wafer surface is planarized. The polishing process is applied in a one-side manner to the back side of the solar cell, that is, the side facing away from the sun, and is particularly advantageous for cell structures that have undergone back-side passivation. The HF/$HNO_3$ polishing etching solution is very highly concentrated (e.g., 8 wt % HF and 50 wt % $HNO_3$). If this solution were also used to eliminate the cutting damage, the reaction would proceed in an uncontrollably violent manner.

The HF/$HNO_3$ texturing mixture has smaller concentrations (for example, 5 wt % HF and 35% $HNO_3$); the etching rate on a surface that has been damaged by wafer cutting is very high and decreases continuously as the cutting damage becomes less. A polished silicon surface is hardly attacked at all by an HF/$HNO_3$ texturing solution.

The etching effect of the solution is largely governed by the structure of the substrate.

Besides nitric acid and hydrofluoric acid, texturing and polishing solutions can contain further components, such as acids (non-oxidizing acids, such as sulfuric acid of phosphoric acid) or organic additives. These further components themselves have no etching effect; however, the etching reaction is modified in the desired direction.

Besides the HF/$HNO_3$ etching solution, other silicon etching solutions are known, composed of hydrofluoric acid and nitrite, chromic acid, bromate, permanganate, or ozone as oxidizing components. Owing to environmental concerns, chromic acid is no longer employed. The other components have not found broad use.

Another method for silicon etching from the semiconductor technology field is anodizing; that is, oxidation is effected electrochemically by application of a voltage to the silicon substrate. In this case, the silicon substrate constitutes the positive electrode. Dilute hydrofluoric acid with ethanol is usually used as electrolyte. The electrolyte solution serves for charge transport.

A layer of porous silicon forms on the substrate surface in the course of the reaction.

The drawback of the electrochemical method is that the substrate being etched has to be in electrically conductive contact with the current source. This is difficult and complicated in the case of thin silicon wafers.

An anodizing method finds application in DE T 696 31 233 for producing a monocrystalline semiconductor on an insulator (SOI structure). In this case, a layer of porous silicon is initially produced by anodizing. A solution of HF, ethanol, and water serves as electrolyte. Proposed for selective removal of the porous silicon layer is a wet-chemical etching operation in which hydrofluoric acid or a liquid mixture of at least alcohol or hydrogen peroxide and hydrofluoric acid, buffered hydrofluoric acid containing an alcohol, or hydrogen peroxide is used as etching solution. It is emphasized in the document that the etching solutions used etch selectively only the regions of porous silicon. The normal regions that have not been porosified are not etched. In this case, the etching reaction proceeds according to an entirely different mechanism than in the case of the aforementioned HF/$HNO_3$ etching solution and is presumably governed by the substrate employed and the structure of the porous silicon formed by anodizing.

The etching solution for selective removal of the porosified layer is composed of dilute hydrofluoric acid. Optionally, it is possible to employ a mixture of dilute hydrofluoric acid and an alcohol or a mixture of hydrofluoric acid and hydrogen peroxide water. The presence of an oxidized component in the etching solution is not essential. Hydrofluoric acid serves as etching agent.

Similar methods for producing SOI structures are described in U.S. Pat. No. 6,180,497 and U.S. Pat. No. 6,375,738 as well as in EP A 0757 377 and EP A 0 926 709.

The substrates used for solar cells cannot be etched solely with hydrofluoric acid. Porous silicon, which is also formed by the HF/$HNO_3$ etching solution under certain conditions is usually removed in a (cold) alkaline solution. In this process, the porous silicon is practically also removed selectively, because the etching rate of an alkaline solution is very low at room temperature for "normal," that is, non-porosified silicon layers.

DE A 195 30 944 relates to a microprocessing of silicon.

In this method, selective etching of a silicon substrate occurs to create three-dimensional structures. In order to enable selective etching, oppositely doped regions are produced on the substrate surface and, as a result, an internal bias voltage is produced between p- and n-doped regions in the presence of an oxidizing electrolyte. The anodic p-doped regions are preferably etched. An etching solution containing hydrofluoric acid and an oxidizing agent is employed as electrolyte.

The following reactions are assumed to take place at the anode, that is, for dissolution of the anodic regions:

$$Si + 2H_2O \rightarrow SiO_2 + 2H_2 \quad \text{Partial reaction 1:}$$

$$SiO_2 + 6HF \rightarrow H_2SiF_6 + 2H_2O. \quad \text{Partial reaction 2:}$$

Silicon is a stronger reducing agent than water and is oxidized to silicon dioxide in this case. In turn, the hydrogen ions of the water molecule are reduced to molecular hydrogen.

The external current source usually required for silicon dissolution is replaced by an internal bias voltage, which is created by charge exchange between the oppositely doped regions.

The method involves a certain anisotropy, that is, dependency of the etching rate on the crystal orientation, but can nonetheless be used for the microprocessing of relatively complicated and irregular forms of silicon.

Used in US A 2009/0280 597 for the smoothing or cleaning of the surface of a silicon solar cell after texturing are solutions based on hydrofluoric acid containing nitric acid or sulfuric acid or ozone or hydrogen peroxide. The texturing is carried out at the start of the production sequences on substrates with base doping.

In the course of the production sequence of crystalline solar cells, the silicon wafers are subjected, after texturing is complete, to one or more cleaning steps in order to ensure the greatest possible degree of cleanness for the subsequent diffusion to form the emitter. Widespread are cleaning solutions of dilute hydrochloric acid or dilute hydrofluoric acid. Optionally, these solutions can also contain hydrogen peroxide or ozone. Also known are alkaline solutions containing hydrogen peroxide.

In this process step, the wafer surface is cleaned of ionic and any organic impurities from the preceding processes. Etching of the surface does not take place.

In crystalline solar cells according to prior art, the emitter can be produced in one or more high-temperature steps by in-diffusion of a dopant of a type opposite to that of the base doping. Low-doped p-type silicon (the concentration of the dopant is on the order of $10^{16}$ atoms/cm$^3$)—generally with boron as base doping—is used as starting material. The uppermost layer of the emitter is highly doped; that is, the concentration of the dopant is generally greater than $10^{18}$ atoms/cm$^3$, in particular greater than $10^{19}$ atoms/cm$^3$. Phosphorus is widely used as dopant. The dopant is forced only into a thin surface layer by the diffusion. The emitter is usually only 200 to 1000 nanometers thick for a total wafer thickness of 100-200 micrometers.

The emitter depth and particularly the surface concentration of the dopant are of importance for the efficiency of the solar cell.

The metal contacts on the front side are produced predominantly by means of thick-film silver pastes in the silk-screen printing process with subsequent sintering. On the one hand, a high phosphorus surface concentration is advantageous for the creation of a low-ohmic contact between the silver paste and the emitter; on the other hand, a correspondingly high surface concentration of the dopant causes more enhanced recombination of the charge carriers and, as a result, a reduced short-circuit current in the solar cell (reduced blue sensitivity). Necessary and advantageous for the production of metal contacts by means of silver pastes is a very exact adjustment of the surface concentration of the dopant. As reference value, $5 \times 10^{20}$ atoms/cm$^3$ is taken.

For more recent metallization technologies, such as, for example, direct metallization with nickel followed by electrolytic silver or copper deposition, very high dopant concentrations are not required for contact formation. These technologies enable the surface concentration of the dopant to be reduced to within the range of around $1 \times 10^{19}$ atoms/cm$^3$.

The surface concentration of the dopant can be influenced in part by the choice of the doping agent, the introduction of the doping agent, and the duration and temperature profile of the diffusion process. Further reduction in the surface concentration can be achieved by chemical or thermal oxidation or by physical or chemical etching processes.

An alternative possibility of avoiding the drawback of a high surface concentration of the dopant is offered by the development of the selective emitter. Thus, the production of a selective emitter via etching back of an emitter, diffused by conventional processes, in the regions between the metal contacts may be inferred from WO A 2009/013307. The regions beneath the metal contacts (standard silk-screen printing process using silver pastes) are protected by an etching barrier introduced beforehand. In the first step, a mixture made up of nitric acid and hydrofluoric acid is used for etching back for controlled production of a porous silicon layer. The etching progress is readily evident, because the porous silicon appears in different colors depending on the layer thickness. In the second step, the porous silicon is subjected to wet-chemical oxidation. Specified as oxidizing agents are $HNO_3$ and $H_2SO_4$. The $SiO_2$ is subsequently removed in dilute HF.

Another and standard method used for simple removal of porous silicon in an etching step is treatment in an alkaline solution, such as, for example, dilute NaOH, dilute KOH, or tetramethylammonium hydroxide.

The emitter layer resistance is a readily accessible parameter, which enables conclusions to be drawn about the surface concentration of the dopant for known emitter depth. The emitter layer resistance is in the range of 50-70 ohm/sq directly after diffusion. After diffusion, the glass formed on the wafer surface is removed in dilute hydrofluoric acid. Use of emitter etching solutions can increase the layer resistance by several ohms, such as, for example, by 1-15 ohm/sq. The eroded emitter layer lies in the range of 1-5 nanometers. In the case of contacting with silk-screen printed silver pastes, the optimum of the emitter etching back is defined by a surface concentration of dopant that is as low as possible, but still adequate for good contact formation. It must be possible to control the emitter etching process very precisely so as to achieve good cell efficiencies.

Alkaline solutions containing hydrogen peroxide and, optionally, further components, such as organic additives, complex-forming agents, and stabilizers, are predominantly employed as emitter etching solutions. Also known is an acidic solution based on tetramethylammonium hydroxide, acetic acid, fluoride, and further components (WO 2010/081661 A3).

For the production of the selective emitter, the layer resistance is increased in the regions between the metal contacts to greater than 100 ohm/sq in order to exploit the advantage of low surface concentration. The eroded emitter layer is on the order of 100 nanometer in size. This strong etching back cannot be accomplished economically by using the emitter etching solutions described. According to the prior art, a solution of hydrofluoric acid and nitric acid is used for strong etching back of the emitter, that is, for increasing the layer resistance by 30-60 ohm/sq, for example.

The concentration of this solution has to be adjusted exactly so that only the required emitter layer is etched off. As described above, the solution composed of hydrofluoric acid and nitric acid is also used as a texturing and polishing etching solution. During these processes, several micrometers of silicon are eroded, whereas in contrast the emitter is only 200-1000 nanometers deep.

The $HF/HNO_3$ solution used for emitter etching back has only a low concentration. The etching reaction results in the formation of porous silicon, which can then be removed by means of an alkaline solution.

A drawback of the $HF/HNO_3$ solution used for emitter etching back is that it is difficult to control the creation of a homogeneous porous Si layer by process engineering, so that, as a consequence of inhomogeneous etching back, a strong scatter of the emitter layer resistance values over the wafer surface results.

The present invention is based on the problem of providing a method for the wet-chemical etching of a highly doped silicon layer in the form a surface region of a solar cell emitter, wherein the drawbacks of prior art, in particular those of the $HF/HNO_3$ solution employed in the prior art, are avoided. At the same time, the possibility of carrying out a homogeneous or isotropic etching back of the emitter should be afforded, for which process times that offer the possibility of not negatively influencing the manufacturing process in a process line may be employed.

To solve this problem, the invention provides essentially that an HF-containing solution containing an oxidizing agent from the group of peroxodisulfates, peroxomonosulfates, and hydrogen peroxide is used as etching solution.

Used in accordance with the invention is an etching solution in which the dominant oxidizing agent is chosen from the group of peroxodisulfates, peroxomonosulfates, and hydrogen peroxide. In departure from prior art, not the nitric acid, but rather the above-mentioned oxidizing agents are used as the oxidizing component that effects the etching reaction in the mixture with hydrofluoric acid.

The etching solution according to the invention offers the possibility of carrying out homogeneous isotropic etching back of an emitter over its surface.

Another advantage of the etching solution according to the invention is that no nitrogen oxides ("NOx gases") are formed in the course of the etching reaction.

It obviously also lies within the scope of the invention when the etching solution contains nitric acid and/or other oxidizing components to a minor extent. What is involved in this case, however, is not the dominant oxidizing agent. Dominant means that the oxidizing agent according to the invention effects the etching reaction.

The following reactions can be formulated for the etching reaction:

Solution with hydrogen peroxide, two-step formal reaction

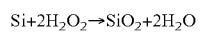

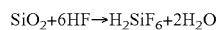

Solution with hydrogen peroxide, assumed actual reaction course

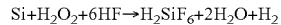

Formed as reaction products are hexafluorosilicic acid, molecular hydrogen (moderate gas evolution was observed during the etching), and water Solution with ammonium peroxodisulfate

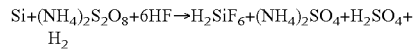

The reaction can be formulated analogously for peroxomonosulfate.

Surprisingly, it has been found that the etching solution used makes possible a homogeneous etching for a doping of greater than $10^{18}$ atoms/cm$^3$, in particular greater than $10^{18}$ atoms/cm$^3$, with the etching rate dropping with decreasing doping.

No etching reaction occurs on substrates with base doping, that is, with a dopant concentration on the order of $10^{16}$ atoms/cm$^3$, as would be expected according to the general assumption that a solution of $HF/H_2O_2$ or HF/peroxodisulfate or HF/peroxomonosulfate does not attack silicon.

When the etching solution according to the invention is used, there occurs a markedly strong etching back than for the alkaline emitter etching solutions used according to prior art. Treatment with the alkaline emitter etching solutions used in standard practice results in only approximately 5 nm of the emitter layer thickness being etched away. The rise in the emitter layer resistance achieved as a result of this lies on the order of 5 ohm/sq.

The acidic etching solution according to the invention enables emitter layer thicknesses of greater than 100 nm to be etched off uniformly, that is, homogeneously and istropically over the surface. The emitter layer resistance can be raised by 50 ohm/sq and more with low scatter of the resistance values over the wafer surface.

If, in accordance with the prior art, emitters are to be strongly etched back, etching solutions based on nitric acid and hydrofluoric acid are employed. The drawback of this solution is that it is technically difficult to realize homogeneous etching back over the surface. Nitrogen oxides form in the course of the etching reaction. These drawbacks are avoided by the teaching of the invention.

The method according to the invention for wet-chemical etching of a highly doped silicon-based emitter layer, that is, a layer with lateral homogeneous doping, by using an HF-containing solution containing an oxidizing agent from the group of peroxodisulfates, peroxomonosulfates, and hydrogen peroxide makes possible a homogeneous etching back of a phosphorus-doped emitter, in particular, preferably for producing a selective emitter. At the same time, porous silicon forms at the wafer surface. The etching progress is evident in this case by the color of the porous silicon. Depending on the concentration of the solution employed and the contact time, the etching back varies from case to case. If a phosphorus-doped wafer side is etched with a solution of HF, $H_2SiF_6$, and ammonium peroxodisulfate of differing concentration, for example, the thickness of the etched-back layer and thus the thickness of the porous silicon increases as a function of the concentration.

The reaction rate or the etching rate of the solution depends strongly on the dopant concentration on the surface. Highly doped regions, with a surface concentration of dopant of greater than $10^{19}$ atoms/cm$^3$, are rapidly etched. With decreasing surface concentration of the dopant, the etching rate becomes lower and drops practically to zero on low-doped regions with a surface concentration of the dopant on the order of $10^{16}$ atoms/cm$^3$.

Measurements have shown that a uniform erosion of the highly doped emitter surface layer occurs. For this purpose, layer resistance measurements were carried out. After doping of a p-type silicon wafer with phosphorus, a layer resistance of 17.5 ohm/sq with a standard deviation of 0.6 was obtained, with the minimum value being 16.5 ohm/sq and the maximum value 18.3 ohm/sq.

After the etching according to the invention, that is, etching back of the highly doped silicon layer, a layer resistance of 71.2 ohm/sq with a standard deviation of 2.4 ohm/sq was obtained, with the minimum value being 68 ohm/sq and maximum value 76 ohm/sq. It is seen that the scatter of the emitter layer resistance is relatively small.

During etching back with the HF-containing solution containing an oxidizing agent, a porous silicon layer is formed, which can be removed using an alkaline solution according to the prior art.

Comparison tests with mixed acids known from prior art, that is, with dilute nitric acid and hydrofluoric acid, for etching back of the emitter layer have shown that a homogeneous etching back is difficult to realize. The tests were carried out under laboratory conditions.

Initially, the layer resistance was measured once again after diffusion. Obtained were values of 20.4 ohm/sq with a standard deviation of 2.0 ohm/sq and a minimum value of 18 ohm/sq and a maximum value of 25 ohm/sq. Etching back with the aforementioned mixed acid was then carried out. Obtained was a layer resistance of 67.9 ohm/sq with a standard deviation of 11.1 and a minimum value of 48 ohm/sq and a maximum value of 91 ohm/sq. The emitter resistance exhibited a high scatter.

It is thus evident that a homogeneous etching back of the emitter is achieved when the etching solution according to the invention is used.

The aqueous etching solution according to the invention preferably has the following composition:
 HF 1-15 wt %, preferably 1.5-5 wt %
 ammonium peroxodisulfate 1-50 wt %, preferably 20-30 wt %

Furthermore, the etching solution according to the invention can contain preferably at least one component from the group sulfuric acid, phosphoric acid, hexafluorosilicic acid, hydrochloric acid, sodium or potassium peroxodisulfate, potassium peroxomonosulfate, hydrogen peroxide, complex-forming agents, and surfactants, with the proportion of the additional components being 0.1-50 wt %, preferably 1-5 wt %.

Alternatively, a preferred etching solution has the following composition:
 HF: 1-15 wt %, preferably 1.5-5 wt %,
 hydrogen peroxide: 0.1-30 wt %, preferably 5-10 wt %, as well as
 preferably at least one component from the group of sulfuric acid, phosphoric acid, hexafluorosilicic acid, hydrochloric acid, sodium peroxodisulfate, potassium peroxodisulfate, potassium peroxomonosulfate, ammonium peroxodisulfate, complex-forming agents, and surfactants, with the proportion of the additional components being 0.1-50 wt %, preferably 1-5 wt %.

The etching solution according to the invention results in homogeneous etching back of the highly doped region, so that the previously created structure (texturing) of the surface is retained. A surface-altering effect, such as a polishing or planarizing effect, of the etching solution would have a detrimental influence on the solar cell. The reflection of the emitter side would be higher and, as a result, the cell efficiency poorer. The etching out of depressions or a non-homogeneous etching back over the surface would damage the emitter and lead to short circuits. The topography of the emitter surface may not be altered appreciably by the etching back.

The etching rate of the invention according to the invention depends on the strength of the doping. The reaction proceeds fastest at the start of the etching back, this being evident in the fast change in color of the layer of porous silicon that forms. The concentration of the dopant is generally higher than $10^{21}$ atoms/cm$^3$ directly after diffusion, particularly after an in-line phosphorus diffusion. The etching rate decreases with progressing etching back and thus decreasing concentration of the dopant on the surface.

The strength of the emitter etching back, that is, the change in the emitter layer resistance, also depends on the composition of the etching solution and, for a given concentration, on the concentrations of components as well as the contact time.

For very short contact times on the order of 15 to 60 seconds, the emitter layer resistance is raised by only a few ohm/sq—for example, by 5 ohm/sq.

If phosphorus is mentioned preferably as dopant, as has been discussed above, the etching solution according to the invention is also suitable for highly doped silicon layers that contain at least one element from the group of phosphorus, arsenic, boron, aluminum, and gallium as dopant.

It is further to be noted that the etching solution according to the invention can be used not only for etching back over the entire surface, but also for etching back of regions of a surface, in particular emitter regions, such as, for example, for the production of selective emitters.

Regardless of this, the homogeneous etching back of the surface region of the emitter of a solar cell ensures that the surface topography is retained.

The invention is also characterized by the use of the aforementioned etching solution for etching back of the emitter, with a metal layer being deposited at least selectively onto the surface of the crystalline solar cell by chemical or electrolytic deposition of a nickel/silver or nickel/copper layer or by physical vapor deposition methods after etching back of the emitter. When a vapor deposition method is used, a titanium/palladium/silver layer, in particular, is deposited.

The field of application of the invention is the manufacture of solar cells made of silicon. Therefore, the invention is characterized by a solar cell, the emitter of which is etched-back by using measures that have been described above.

The teaching according to the invention will be discussed in detail below on the basis of examples, from which ensue further advantages and features.

EXAMPLE 1

After in-diffusion of phosphorus (concentration of dopant greater than $10^{19}$ atoms/cm$^3$) in p-type silicon wafers with boron as base doping in a boron concentration of about $10^{16}$ atoms/cm$^3$, the wafers were treated in an aqueous etching solution having the following composition:
 hydrofluoric acid, 5 wt %
 sodium peroxodisulfate, 5 wt %

The contact time was 8 minutes at room temperature. The wafers were etched horizontally in a laboratory setup. Wafers were employed directly after diffusion without pretreatment; that is, the phosphosilicate glass was removed in an etching step together with the actual emitter etching back. The layer of porous silicon formed was brownish violet and uniformly colored.

The measurement of the layer resistance after diffusion gave a mean value of 45.5 ohm/sq with a standard deviation of 1.3. After the etching step, the layer resistance was 94.0 ohm/sq with a standard deviation of 5.2. The measurement of the layer resistance after the etching step was carried out on the layer of porous silicon.

EXAMPLE 2

Wafers according to Example 1 were treated in an aqueous etching solution having the following composition:
hydrofluoric acid, 10 wt %
sulfuric acid, 10 wt %
hydrogen peroxide, 10 wt %

The contact time was 3 minutes at room temperature. The wafers were etched horizontally in a laboratory setup. The phosphosilicate glass was removed in the same etching step. The wafer surface was light tan in color after the etching step.

The measurement of the layer resistance after diffusion gave a mean value of 48.9 ohm/sq with a standard deviation of 1.8. After the etching step, the layer resistance was 65.5 ohm/sq with a standard deviation of 3.0. The measurement of the layer resistance after the etching step was carried out on the layer of porous silicon.

EXAMPLE 3

Wafers according to Example 1 were treated in an aqueous etching solution having the following composition:
hydrofluoric acid, 2 wt %
hexafluorosilicic acid, 2 wt %
ammonium peroxodisulfate, 25 wt %

The contact time was 10 minutes at room temperature. The wafers were etched horizontally in a laboratory setup. The phosphosilicate glass was removed in the same etching step. The wafer surface was gold in color after the etching step. The bottom side, on which a weak phosphorus doping is present only in places, was largely unchanged. A slight discoloration was visible only at the phosphorus-doped places.

The measurement of the layer resistance after diffusion gave a mean value of 22.0 ohm/sq with a standard deviation of 1.6. After the etching step, the layer resistance was 84.6 ohm/sq with a standard deviation of 3.1. The measurement of the layer resistance after the etching step was carried out on the layer of porous silicon.

EXAMPLE 4

Wafers according to Example 1 were treated in an aqueous etching solution having the following composition:
hydrofluoric acid, 2 wt %
hexafluorosilicic acid, 2 wt %
ammonium peroxodisulfate, 25 wt %

The contact time was 15 minutes at room temperature. The wafers were etched horizontally in a laboratory setup. The phosphosilicate glass was removed in the same etching step.

The wafer surface was dark blue-green in color after the etching step. The measurement of the layer resistance after diffusion gave a mean value of 17.5 ohm/sq with a standard deviation of 0.6. After the etching step, the layer resistance was 71.2 ohm/sq with a standard deviation of 2.4.

Subsequently, the porous silicon was removed in dilute potassium hydroxide solution. The solution contained 0.3 wt % KOH. The wafers were treated for 2.5 minutes at room temperature. The measurement of the layer resistance after removal of the porous silicon gave a mean value of 92.8 ohm/sq with a standard deviation of 3.4.

The wafers were then treated in a horizontal unit in the following process solutions: dilute hydrofluoric acid, chemical edge isolation, alkaline emitter etching solution. The measurement of the layer resistance after this etching sequence gave a mean value of 97.6 ohm/sq with a standard deviation of 3.6.

As final treatment prior to nitride coating, an RCA cleaning was carried out. This cleaning comprises the following process steps:
"SC 1" solution, containing ammonia and hydrogen peroxide.
The contact time was 10 minutes at 60° C.
Rinsing
"SC 2" solution, containing hydrochloric acid and hydrogen peroxide.
The contact time was 10 minutes at 60° C.
Rinsing and drying.

The measurement of the layer resistance after this RCA sequence gave a mean value of 101.6 ohm/sq with a standard deviation of 3.3.

The invention claimed is:

1. A method for the wet-chemical etching back of a surface region of an emitter of a crystalline solar cell in an etching solution, the surface region having a dopant concentration of greater than $10^{18}$ atoms/cm$^3$, comprising:
applying an etching solution on the surface region to carry out homogeneous isotropic etching back of the emitter over the surface region of the emitter, the etching solution being an aqueous solution comprising HF: 1-15 wt % and ammonium peroxodisulfate: 1-50 wt %.

2. The method according to claim 1, wherein the etching solution further comprises at least one component selected from the group consisting of complexing agents and surfactants.

3. The method according to claim 2, wherein the complexing agent is a complex-forming agent selected from the group consisting of hydroxyphenols, amines, hydroxycarboxylic acids, polyalcohols, phosphonic acids, and polyphosphates.

4. The method according to claim 1, wherein the etching solution further comprises at least one additional acid selected from the group consisting of sulfuric acid, phosphoric acid, hydrochloric acid, and H$_2$SiF$_6$ (hexafluorosilicic acid).

5. The method according to claim 1, wherein the composition comprises HF: 1.5-5 wt %.

6. The method according to claim 1, wherein the composition comprises ammonium peroxodisulfate: 20-30 wt %.

7. The method according to claim 1, wherein the surface region comprises a dopant selected from the group consisting of phosphorus, arsenic, boron, aluminum, and gallium.

8. The method according to claim 1, wherein the step of applying the etching solution further comprises producing a selective emitter.

* * * * *